(12) United States Patent
Lin et al.

(10) Patent No.: US 11,508,679 B2
(45) Date of Patent: Nov. 22, 2022

(54) POLYMER RESIN AND COMPRESSION MOLD CHIP SCALE PACKAGE

(71) Applicant: SEMICONDUCTOR COMPONENTS INDUSTRIES, LLC, Phoenix, AZ (US)

(72) Inventors: Yusheng Lin, Phoenix, AZ (US); Soon Wei Wang, Seremban (MY); Chee Hiong Chew, Seremban (MY); Francis J. Carney, Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 124 days.

(21) Appl. No.: 17/068,172

(22) Filed: Oct. 12, 2020

(65) Prior Publication Data
US 2021/0028133 A1    Jan. 28, 2021

Related U.S. Application Data

(62) Division of application No. 16/364,104, filed on Mar. 25, 2019, now Pat. No. 10,825,786, which is a
(Continued)

(51) Int. Cl.
*H01L 23/31* (2006.01)
*H01L 21/683* (2006.01)
(Continued)

(52) U.S. Cl.
CPC ............ *H01L 24/02* (2013.01); *H01L 21/561* (2013.01); *H01L 21/568* (2013.01); *H01L 21/6836* (2013.01); *H01L 21/78* (2013.01); *H01L 23/3114* (2013.01); *H01L 23/3185* (2013.01); *H01L 23/544* (2013.01); *H01L 24/03* (2013.01); *H01L 24/05* (2013.01); *H01L 24/13* (2013.01); *H01L 24/94* (2013.01); *H01L 24/96* (2013.01); *H01L 2221/68327* (2013.01); *H01L 2223/5448* (2013.01); *H01L 2223/54406* (2013.01); *H01L 2223/54486* (2013.01); *H01L 2224/024* (2013.01); *H01L 2224/0239* (2013.01); *H01L 2224/02315* (2013.01); *H01L 2224/0346* (2013.01); *H01L 2224/0401* (2013.01); *H01L 2224/05571* (2013.01);
(Continued)

(58) Field of Classification Search
CPC ............... H01L 24/96; H01L 2224/024; H01L 2224/0401; H01L 23/3114
See application file for complete search history.

(56) References Cited

U.S. PATENT DOCUMENTS 6,627,997 B1 *   9/2003   Eguchi ................ H01L 23/4334
                                                          257/713
6,833,619 B1   12/2004   Jang et al.
(Continued)

*Primary Examiner* — Dale E Page
*Assistant Examiner* — Wilner Jean Baptiste
(74) *Attorney, Agent, or Firm* — Adam R. Stephenson, LTD.

(57) ABSTRACT

A method for fabricating a chip scale package, comprising: providing a wafer; applying a polymer resin on at least part of a first surface of the wafer and to one or more sides of the wafer; and applying a compression mold on at least part of a second surface of the wafer and to one or more sides of the wafer, said first and second surfaces opposing each other.

15 Claims, 11 Drawing Sheets

Related U.S. Application Data division of application No. 15/168,467, filed on May 31, 2016, now Pat. No. 10,283,466.

(51) Int. Cl.
*H01L 23/00* (2006.01)
*H01L 21/56* (2006.01)
*H01L 21/78* (2006.01)
*H01L 23/544* (2006.01)

(52) U.S. Cl.
CPC ............... *H01L 2224/05644* (2013.01); *H01L 2224/05647* (2013.01); *H01L 2224/05655* (2013.01); *H01L 2224/11334* (2013.01); *H01L 2224/11849* (2013.01); *H01L 2224/131* (2013.01); *H01L 2224/13024* (2013.01); *H01L 2224/94* (2013.01); *H01L 2224/96* (2013.01)

(56) References Cited

U.S. PATENT DOCUMENTS

| | | | |
|---|---|---|---|
| 7,833,881 B2 | 11/2010 | Farnworth | |
| 9,466,545 B1 * | 10/2016 | Scanlan | H01L 25/03 |
| 9,947,716 B2 * | 4/2018 | Ho | H01L 21/67017 |
| 2001/0042902 A1 | 11/2001 | Wakabayashi et al. | |
| 2005/0082651 A1 | 4/2005 | Farnworth et al. | |
| 2005/0148160 A1 | 7/2005 | Farnworth et al. | |
| 2005/0227415 A1 | 10/2005 | Farnworth et al. | |
| 2006/0154447 A1 | 7/2006 | Kushima et al. | |
| 2008/0116545 A1 | 5/2008 | Grinman et al. | |
| 2009/0045525 A1 | 2/2009 | Matsushima et al. | |
| 2014/0091458 A1 | 4/2014 | Van Gemert et al. | |
| 2015/0102502 A1 | 4/2015 | Chiu et al. | |

* cited by examiner

POLYMER RESIN AND COMPRESSION MOLD CHIP SCALE PACKAGE

CROSS REFERENCE TO RELATED APPLICATIONS

This application is a divisional application of the earlier US Utility Patent Application to Lin et al. entitled "Polymer Resin and Compression Mold Chip Scale Package," application Ser. No. 16/364,104, filed Mar. 25, 2019, now pending, which was a divisional application of the earlier U.S. Utility Patent Application to Yusheng Lin entitled "Polymer Resin and Compression Mold Chip Scale Package," application Ser. No. 15/168,467, filed May 31, 2016, now U.S. Pat. No. 10,283,466, issued May 7, 2019, the disclosures of each of which are hereby incorporated entirely herein by reference.

BACKGROUND

Semiconductor die (also known as "chips") are often encapsulated within packages to prevent physical damage and corrosion. Current packaging processes typically are lengthy and require relatively expensive materials (e.g., lead frames and gold wires). In addition, these processes result in packages that constrain the die size—for example, due to the presence of large flags that are necessary to accommodate the die.

SUMMARY

In at least some embodiments, a method for fabricating a chip scale package comprises: providing a wafer; applying a polymer resin on at least part of a first surface of the wafer and to one or more sides of the wafer; and applying a compression mold on at least part of a second surface of the wafer and to one or more sides of the wafer, said first and second surfaces opposing each other. These embodiments may be supplemented using one or more of the following concepts, in any order and in any combination: thinning said wafer; etching one or more trenches in said first surface of the wafer; applying a mask to said first surface to facilitate said application of the polymer resin, wherein at least some of said polymer resin fills at least part of said one or more trenches; applying a metallization to areas of the first surface using the mask; etching one or more trenches in the second surface to contain at least part of said compression mold; depositing one or more solder units on said metallization; and cutting along said one or more trenches in the first and second surfaces of the wafer to produce a chip scale package; wherein thinning the wafer comprises achieving an average wafer thickness of 100 microns to 250 microns; wherein thinning the wafer comprises achieving a wafer thickness along a perimeter of the wafer that is greater than a different wafer thickness at a center of the wafer; wherein applying said metallization comprises performing electroless plating using either copper or a combination of nickel and gold; applying a photoresist coat to the second surface before etching said one or more trenches in the second surface; wherein etching one or more trenches in the second surface comprises etching through the wafer to the polymer resin contained in the one or more trenches in the first surface; wherein the one or more solder units are solder balls; wherein the one or more solder units are printed onto the metallization, and further comprising reflowing said solder units to form solder bumps; wherein etching said one or more trenches in the second surface comprises using an etching technique selected from the group consisting of: deep reactive-ion etching (DRIE) and narrow saw street etching (NSS); further comprising etching one or more trenches in the first surface to contain at least some of said polymer resin, said etching performed using an etching technique selected from the group consisting of: deep reactive-ion etching (DRIE) and narrow saw street etching (NSS); wherein said polymer resin is selected from the group consisting of: polyimide (PI) and polybenzoxazoles (PBO).

In at least some embodiments, a chip scale package comprises: a semiconductor die; a polymer resin coating on a first surface of the die; a metallization on the first surface of the die; solder units on said metallization; and a compression mold on a second surface of the die. At least some of these embodiments may be supplemented using one or more of the following concepts, in any order and in any combination: wherein the polymer resin coating is selected from the group consisting of: polyimide (PI) and polybenzoxazoles (PBO); wherein the semiconductor die has at least one stepped side; wherein the polymer resin coating is on at least part of a side of the die, and wherein at least a portion of said side lies in a plane orthogonal to a plane in which the first surface lies; wherein the compression mold is on at least part of a side of the die, and wherein at least a portion of said side lies in a plane orthogonal to a plane in which the second surface lies; wherein the solder units are solder balls; wherein the solder units are reflowed bumps; wherein the metallization is selected from the group consisting of: electroless nickel and gold plating; and copper plating; wherein said compression mold comprises a material selected from the group consisting of: polyamides, polyimides, polyamide-imides, polyphenylene sulfide (PPS), polyether ether ketone (PEEK), and polyester fiberglass resin.

At least some embodiments are directed to a method for fabricating a chip scale package, comprising: providing a wafer having metallization on a top surface; and applying a compression mold to a bottom surface of said wafer, to side surfaces of said wafer, and to a perimeter of said top surface of the wafer. These embodiments may be supplemented using one or more of the following concepts, in any order and in any combination: further comprising applying a tape to said top surface, and wherein applying said compression mold comprises using sufficient pressure to cause at least some of said compression mold to seep between said tape and the top surface; wherein said compression mold applied to said perimeter of the top surface forms one or more strips, said one or more strips having an average width between 40 micrometers and 60 micrometers, inclusive; further comprising: using a sputtering technique to deposit a metallic layer on said top surface, using a photoresist to deposit said metallization on the top surface, etching away at least part of said metallic layer, back-grinding said bottom surface, applying a first tape to said bottom surface, dividing the wafer into multiple pieces, flipping the wafer pieces and applying a second tape to the top surfaces of the pieces, removing the first tape, removing the second tape after applying said compression mold; and producing a singulated chip scale package.

In at least some embodiments, a chip scale package comprises: a semiconductor die having a top surface, a bottom surface, and side surfaces; metallization on said top surface of the semiconductor die; and a compression mold on said bottom surface of the die, on said side surfaces of the die, and on a portion of the top surface of the die, wherein said portion is a strip along at least part of the perimeter of the top surface. These embodiments may be supplemented using one or more of the following concepts, in any order and in any combination: wherein said strip has an average width between 40 and 60 micrometers, inclusive; wherein said strip occupies between 20 percent and 40 percent, inclusive, of the total area of the top surface; wherein the compression mold is made of a material selected from the group consisting of: polyamides, polyimides, polyamide-imides, polyphenylene sulfide (PPS), polyether ether ketone (PEEK), and polyester fiberglass resin; wherein the top and bottom surfaces oppose each other.

Figure 1A:
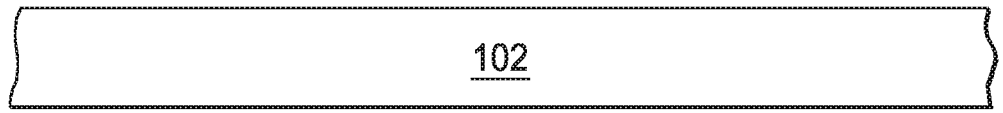
FIGS. 1A-1I are cross-sectional schematic diagrams illustrating a chip packaging process flow.

It should be understood, however, that the specific embodiments given in the drawings and detailed description thereto do not limit the disclosure. On the contrary, they provide the foundation for one of ordinary skill to discern the alternative forms, equivalents, and modifications that are encompassed together with one or more of the given embodiments in the scope of the appended claims. The term "couple," as used herein, denotes a direct or indirect connection.

DETAILED DESCRIPTION

Disclosed herein are techniques for efficiently packaging semiconductor die. These techniques mitigate costs by reducing the amount of packaging material used relative to the amount of material used in many current techniques. In addition, packages produced according to these techniques contain die that occupy a greater-than-typical percentage of available space within the package, due in large part to the reduction in materials needed for encapsulation. The techniques generally entail thinning a wafer and etching a first surface of the wafer to create trenches that are subsequently filled using a suitable polymer resin with the aid of a mask. Masked areas of the first surface are metallized using electroless nickel and gold or copper plating. Bottom trenches are etched into the opposing surface of the wafer and are filled using a suitable encapsulation mold. In this way, the chip scale package is formed. The package is then marked, and solder units (e.g., balls or printed units) is deposited on the metallization. In the case of printed solder units, the units are reflowed to form solder bumps. The wafers are then singulated along the etched trenches to create multiple, singulated chip scale packages. Alternative techniques present additional advantages, such as preventing solder from climbing the sides of a wafer and making undesirable electrical connections. Such techniques generally entail providing a wafer with suitable metallization and applying a compression mold to a bottom surface of the wafer, to side surfaces of the wafer, and to a perimeter of the top surface of the wafer. These and other techniques are now described.

Figure 1B:
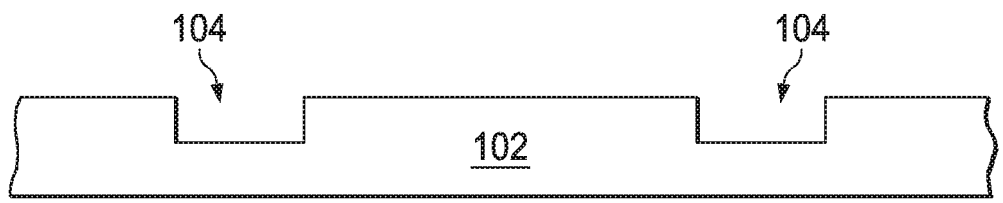
Figure 1C:
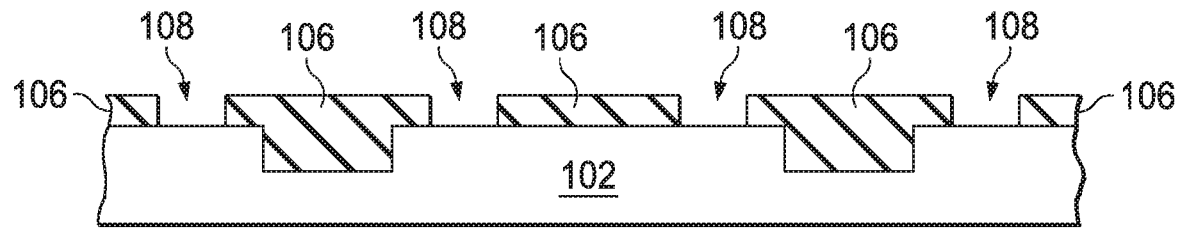
Figure 1D:
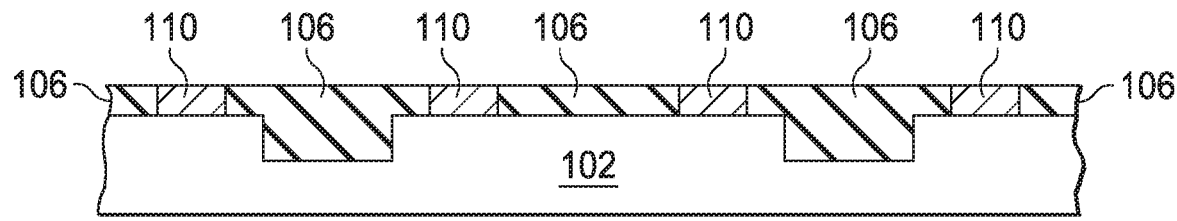
Figure 1E:
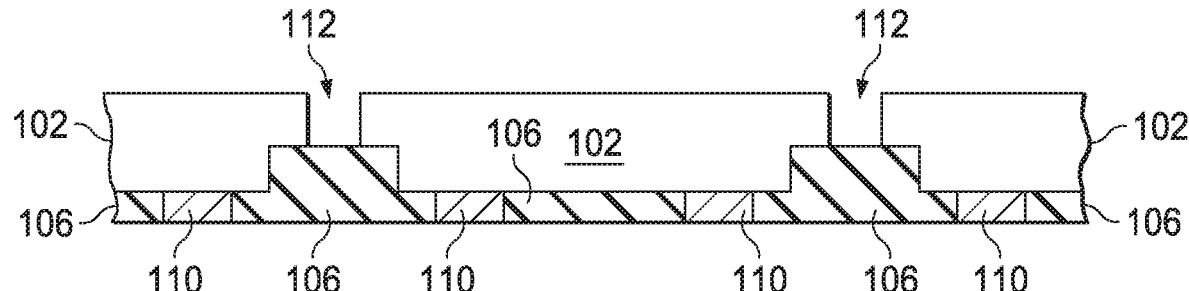
Figure 1F:
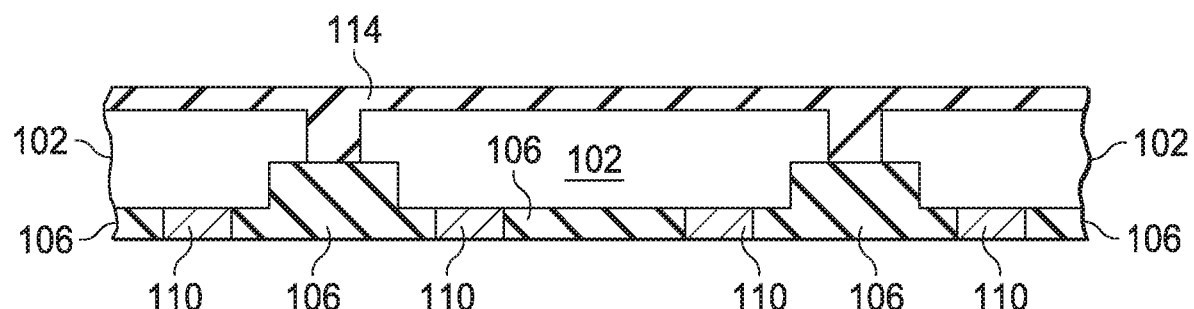
Figure 1G:
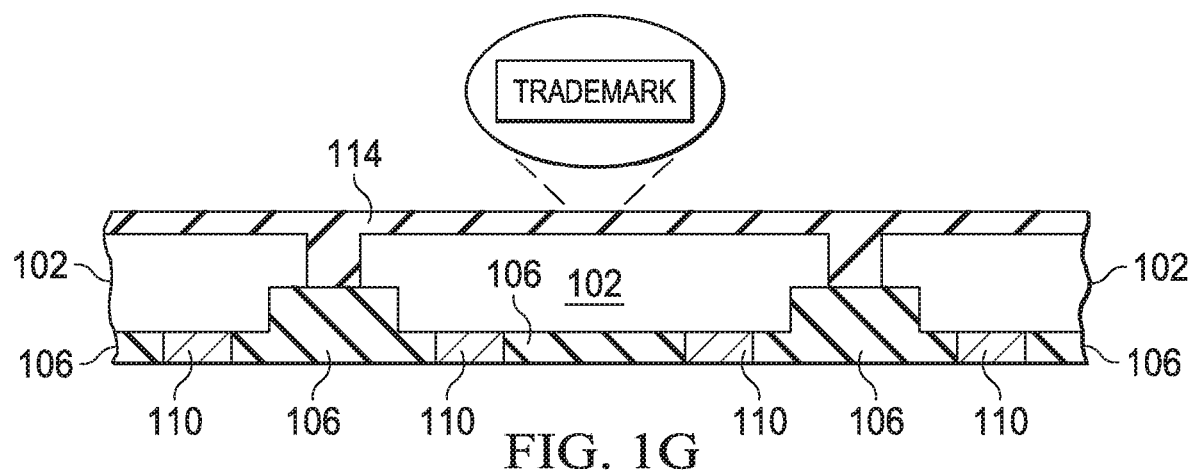
Figure 1H:
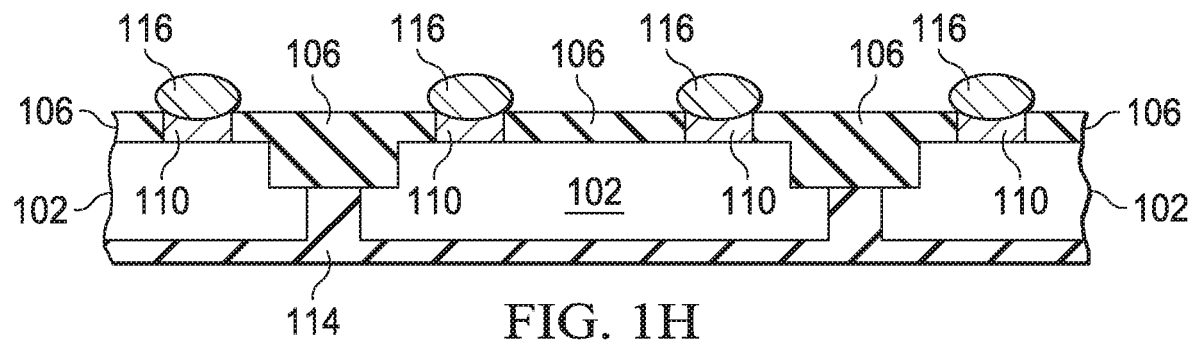
Figure 1I:
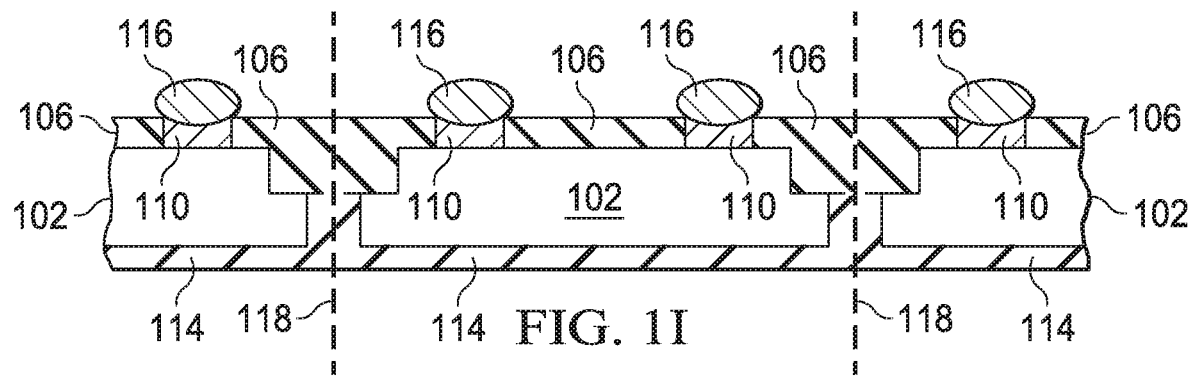
Figure 2:
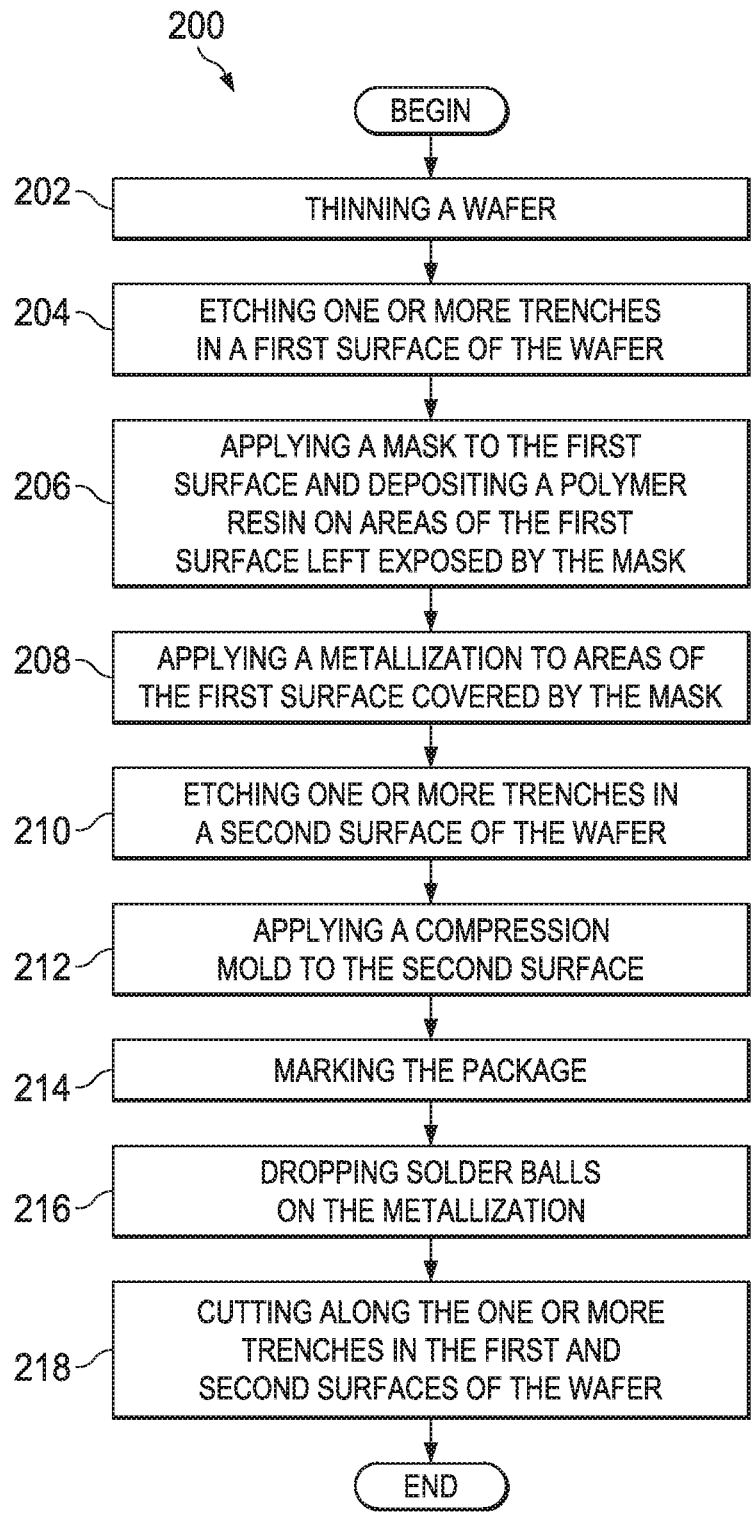
FIG. 2 is a flow diagram of a method used to package a chip as shown in FIGS. 1A-1I.

FIGS. 1A-1I illustrate a cross-sectional view of a chip packaging process flow in accordance with various embodiments, and FIG. 2 is a flow diagram of a method 200 used to package a chip as shown in FIGS. 1A-H. Accordingly, the steps illustrated in FIG. 2 are described in the context of FIGS. 1A-H. The method 200 begins with thinning a wafer (step 202). This step is shown in corresponding FIG. 1A as a thinned wafer 102. The wafer 102 may be composed of any suitable semiconductor material—for example and without limitation, silicon, germanium or gallium. The wafer 102 is thinned using any suitable method—for instance, and without limitation, mechanical grinding, chemical mechanical polishing (CMP), wet etching, or atmospheric downstream plasma dry chemical etching (ADP-DCE). The method 200 is not limited to these thinning techniques, however, and any and all suitable thinning techniques are included within the scope of this disclosure.

In at least some embodiments, the wafer 102 is an ultra-thin wafer. In at least some embodiments, the thickness of the wafer 102 is between 100 microns and 250 microns, although other thicknesses are contemplated. In some embodiments, the wafer 102 comprises a TAIKO ring such that the perimeter of the wafer 102 has a greater thickness than a center of the wafer 102. (The term "perimeter," as used herein, generally refers to the portions of the top or bottom surface of a wafer that are proximal to the edges of that surface.) For example, in some such embodiments in which a TAIKO ring is used, the ring is between approximately (i.e., within 15% of) 3 mm and 5 mm in width along the perimeter of the wafer 102, and the remaining portion of the wafer 102 has a lesser thickness. However, a TAIKO ring is not required, and in some embodiments, no TAIKO ring is used. FIG. 1A, as with the remaining FIGS. 1B-1I, illustrates merely a portion of the entire wafer 102.

The method 200 then comprises etching one or more trenches in a first (i.e., top) surface of the wafer (step 204). This step is illustrated in FIG. 1B, in which multiple trenches 104 are etched into a first surface of the wafer 102. As mentioned above, the view shown in FIG. 1B (and in the other process flow diagrams) is merely a portion of the overall wafer 102. Accordingly, although only two illustrative trenches 104 are shown, the wafer 102 may in fact have dozens, hundreds, thousands or more trenches per wafer. In at least some embodiments, the trenches 104 are formed using a suitable etching technique, such as and without limitation, deep reactive-ion etching (DRIE) or narrow saw street etching (NSS). The method 200 is not limited to these particular etching techniques, however, and other etching techniques are contemplated and fall within the scope of this disclosure. Further, although the widths of the trenches may vary as desired, in at least some embodiments, the trenches 104 are 80 micrometers wide. Similarly, although the depths of the trenches may vary as desired, in some embodiments, the trenches 104 are 50 micrometers deep.

The method 200 next includes applying a mask to the first surface and depositing a polymer resin on areas of the first surface left exposed by the mask (step 206). This step is illustrated in FIG. 1C, in which multiple polymer resin segments 106 are deposited on the first surface of the wafer 102 (including the trenches 104) in accordance with the mask that is used. The mask may be any suitable mask, such as a solder mask, and it may be formed as desired to accommodate metallization in the areas 108 that are protected by the mask. The polymer resin 106 may comprise polyimides (PI) and/or polybenzoxazoles (PBO), although the scope of disclosure is not limited as such. Further, although the view in FIG. 1C shows a particular pattern for the resin 106 and masked areas 108, this pattern may vary when viewing other cross-sectional segments of the same wafer 102. The thickness of the polymer resin layer 106 may vary, although in some embodiments, it is between approximately 25 microns and 75 microns.

The method 200 subsequently comprises applying a metallization to the areas of the first surface covered by the mask (step 208). This step is illustrated in FIG. 1D. In FIG. 1D, the areas 108 formerly protected by the mask of step 206 are filled with the metallization 110. The type of metallization used may vary and is chosen as desired. In some embodiments, the metallization includes electroless nickel and gold plating. In some embodiments, the metallization includes copper plating. Other types of metallization also may be used and may include any type of conducting material suitable for use in chip scale packaging applications. The step 208 includes any necessary pre-treatment of the areas 108 to accommodate the electroless plating shown in FIG. 1D.

In step 210, the method 200 comprises etching one or more trenches in a second (i.e., bottom) surface of the wafer. This step is shown in FIG. 1E, in which trenches 112 are formed in the second surface of the wafer 102. In some embodiments, the trenches 112 are vertically aligned with the trenches 104, as shown in FIGS. 1B and 1E. In some embodiments, the trenches 112 have a narrower width (e.g., 40 micrometers) than the trenches 104, although the scope of disclosure is not limited as such. In at least some embodiments, the trenches 112 are deeper (e.g., 100 micrometers) than the trenches 104, but other depths are contemplated. The trenches 112 preferably are deep enough so that they reach the polymer resin 106 in trenches 104—i.e., so that the trenches 104 and 112 are connected. The etching step 210 may be performed using any suitable etching technique, but in at least some embodiments, it is performed using DRIE or NSS. Furthermore, the second surface of the wafer 102 may be coated with a photoresist prior to etching so that areas of the second surface that are not to be etched are protected and so that the areas corresponding to trenches 112 are left exposed.

The next step 212 of method 200 comprises applying a compression mold to the second surface of the wafer. FIG. 1F illustrates this step. Specifically, a compression mold 114 is formed to match the bottom surface of the wafer 102, including the trenches 112. The compression mold 114 should cover some or all of the bottom surface of the wafer 102, and it should fill the trenches 112 completely, although other compression molds are contemplated. In at least some embodiments, the compression mold 114 that is deposited on the second surface of the wafer 102 but outside of the trenches 112 has a thickness of between approximately 25 microns to 75 microns, although this thickness may vary. Any suitable compression mold material may be used, including, without limitation, polyamides, polyimides, polyamide-imides, polyphenylene sulfide (PPS), polyether ether ketone (PEEK), and/or polyester fiberglass resin systems.

The method 200 then comprises marking the package (step 214; FIG. 1G) using any suitable information, including part numbers, appropriate trademarks, patent numbers, and the like. Next, the method 200 includes dropping solder balls on the metallization (step 216). This step is illustrated in FIG. 1H, in which the solder balls 116 are deposited on the metallization 110. In some embodiments, multiple solder balls 116 are deposited on the same metallization, and, in such embodiments, the solder balls 116 are spaced with any suitable pitch. The solder balls 116 may be sized as desired, although in at least some embodiments, the balls 116 fully cover the width of the metallization 110 on which they are dropped. A singulation is then performed along the trenches 104 and 112 using, e.g., a diamond blade, as lines 118 indicate in FIG. 1I (step 218). In at least some embodiments, this singulation is performed at the midpoint of the widths of the trenches 104 and 112. As a result of step 218, a single wafer 102 is divided into one or more chip scale packages. The resulting chip scale package contains a portion of the wafer 102, metallizations 110, and solder balls 116 on the metallizations 110. The wafer 102 is entirely encapsulated by the polymer resin 106 and the compression mold 114 on opposing surfaces of the wafer 102. The sides of the wafer 102 are stepped due to the shapes of the trenches 104 and 112, and each of the sides of the wafer 102 is encapsulated by the polymer resin 106 and the compression mold 114. The method 200 may be adjusted as desired, including by adding, deleting or modifying one or more steps.

Figure 3A:
FIGS. 3A-3J are cross-sectional schematic diagrams illustrating an alternative chip packaging process flow.
Figure 3B:
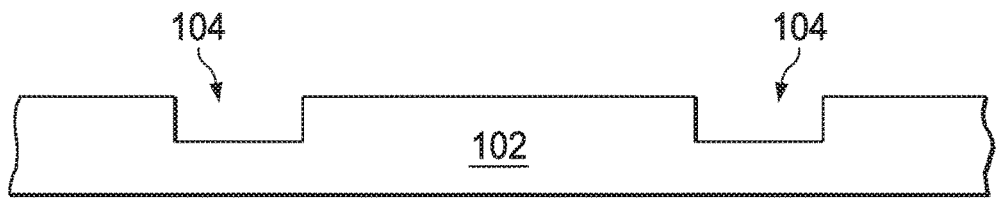
Figure 3C:
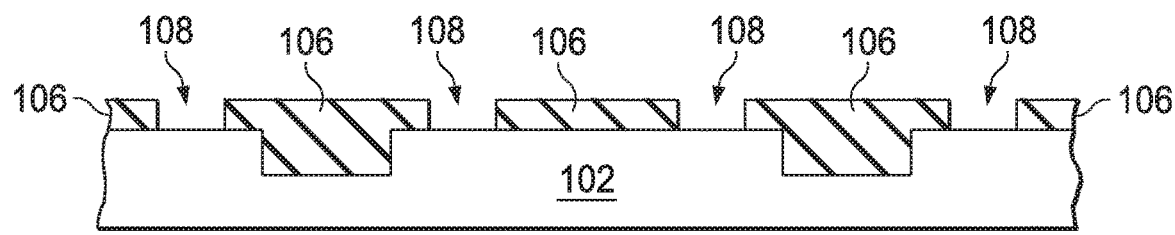
Figure 3D:
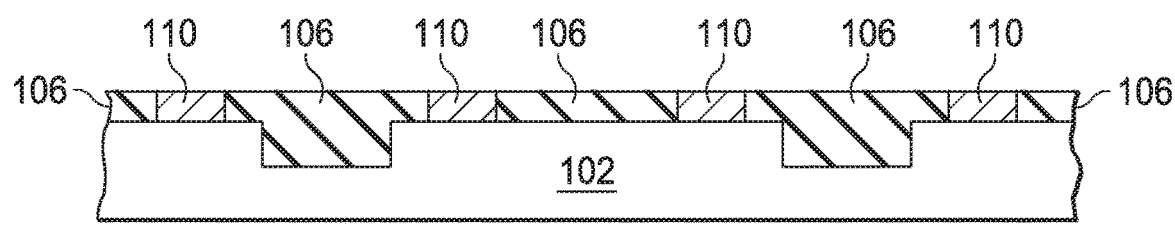
Figure 3E:
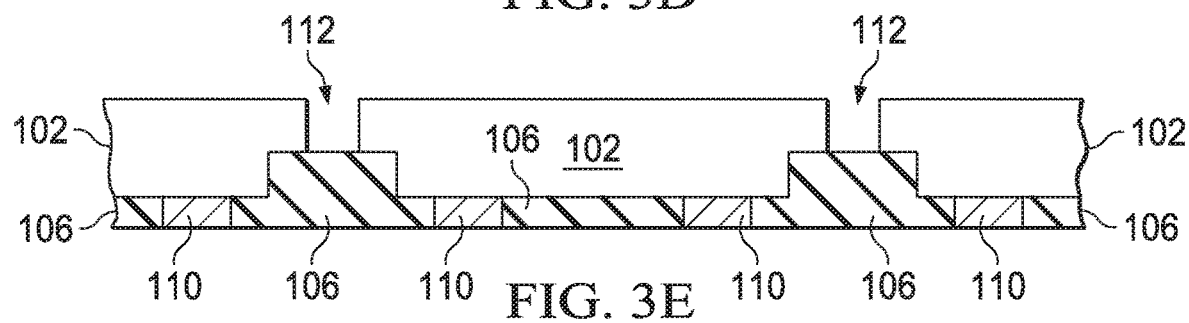
Figure 3F:
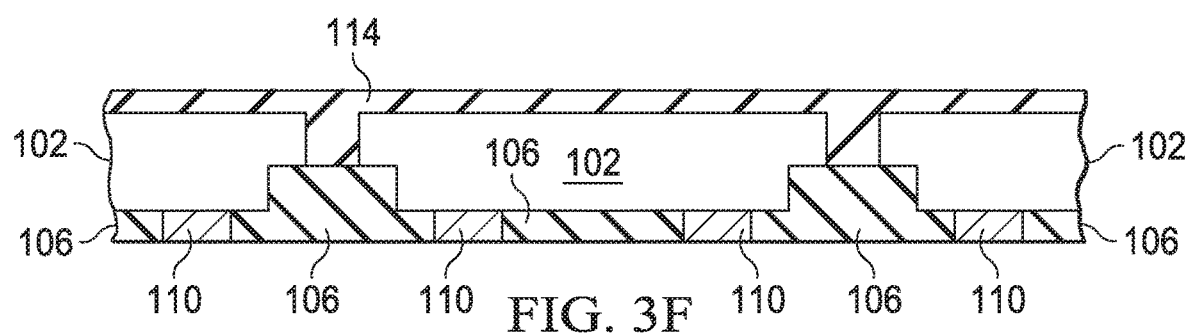
Figure 3G:
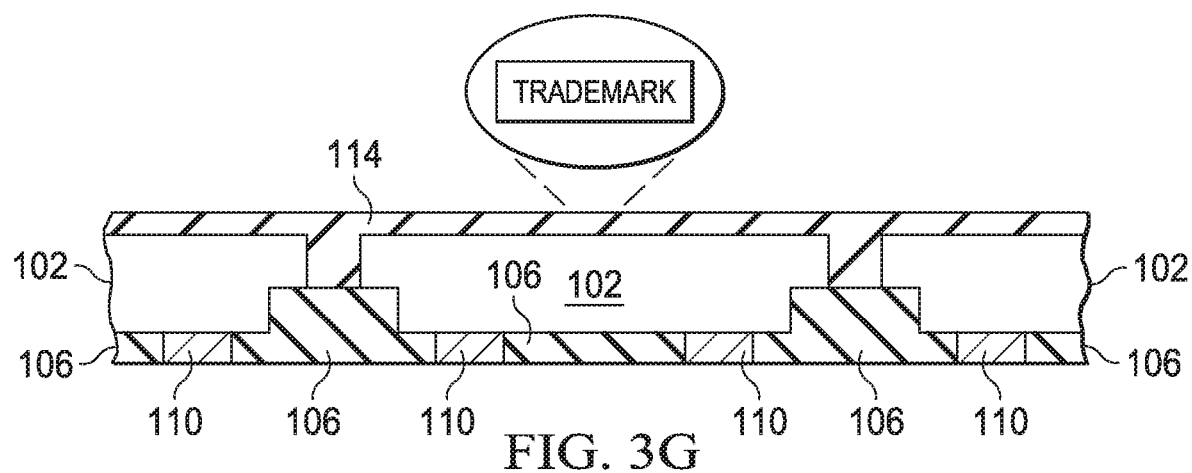
Figure 3H:
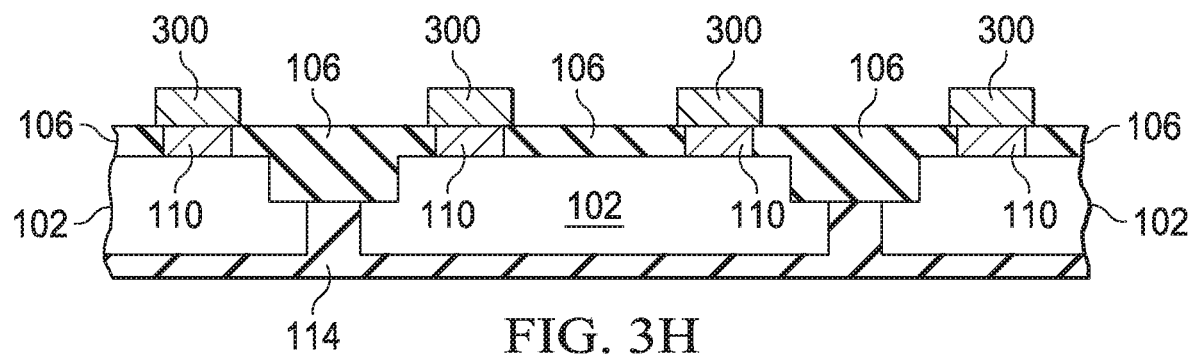

FIGS. 3A-3J illustrate an alternative chip packaging process flow. FIG. 4 is a flow diagram of a method 400 used to produce a chip scale package as shown in FIGS. 3A-3J. Because the steps of the method 400 are illustrated in FIGS. 3A-3J, these figures are described in relation to each other. The method steps 402, 404, 406, 408, 410, 412 and 414 are similar or identical to the method steps 202, 204, 206, 208, 210, 212 and 214 of FIG. 2. The steps 402, 404, 406, 408, 410, 412 and 414 are illustrated in FIGS. 3A-3G, respectively.

Step 416 comprises printing solder units on the metallization. This step is illustrated in FIG. 3H, in which solder units 300 are printed onto the metallization 110. Printing solder units is often a more cost-effective technique than dropping solder balls. In some embodiments, the printed solder units 300 are of the same width as the metallization 110 on which they are printed, but the scope of disclosure is not limited as such.

Figure 3I:
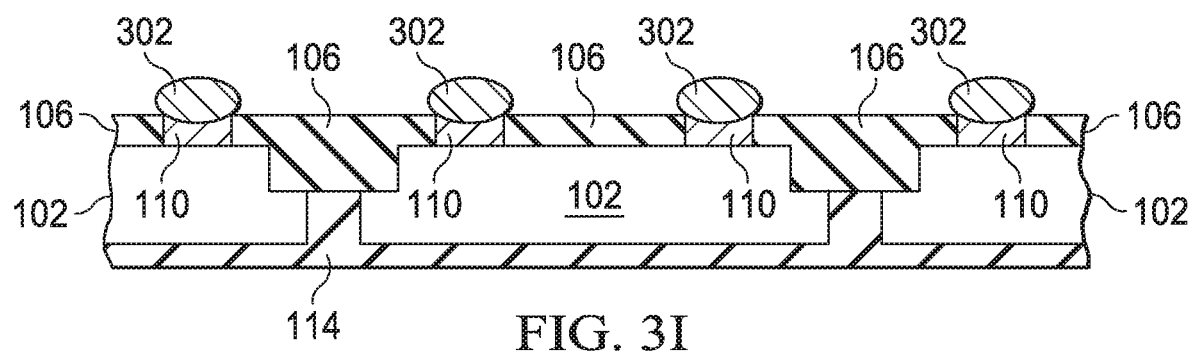
Figure 3J:
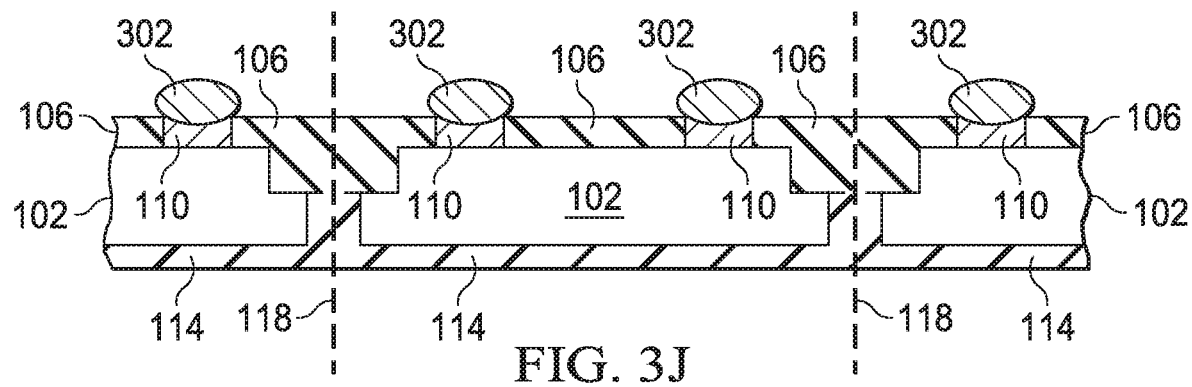
Figure 4:
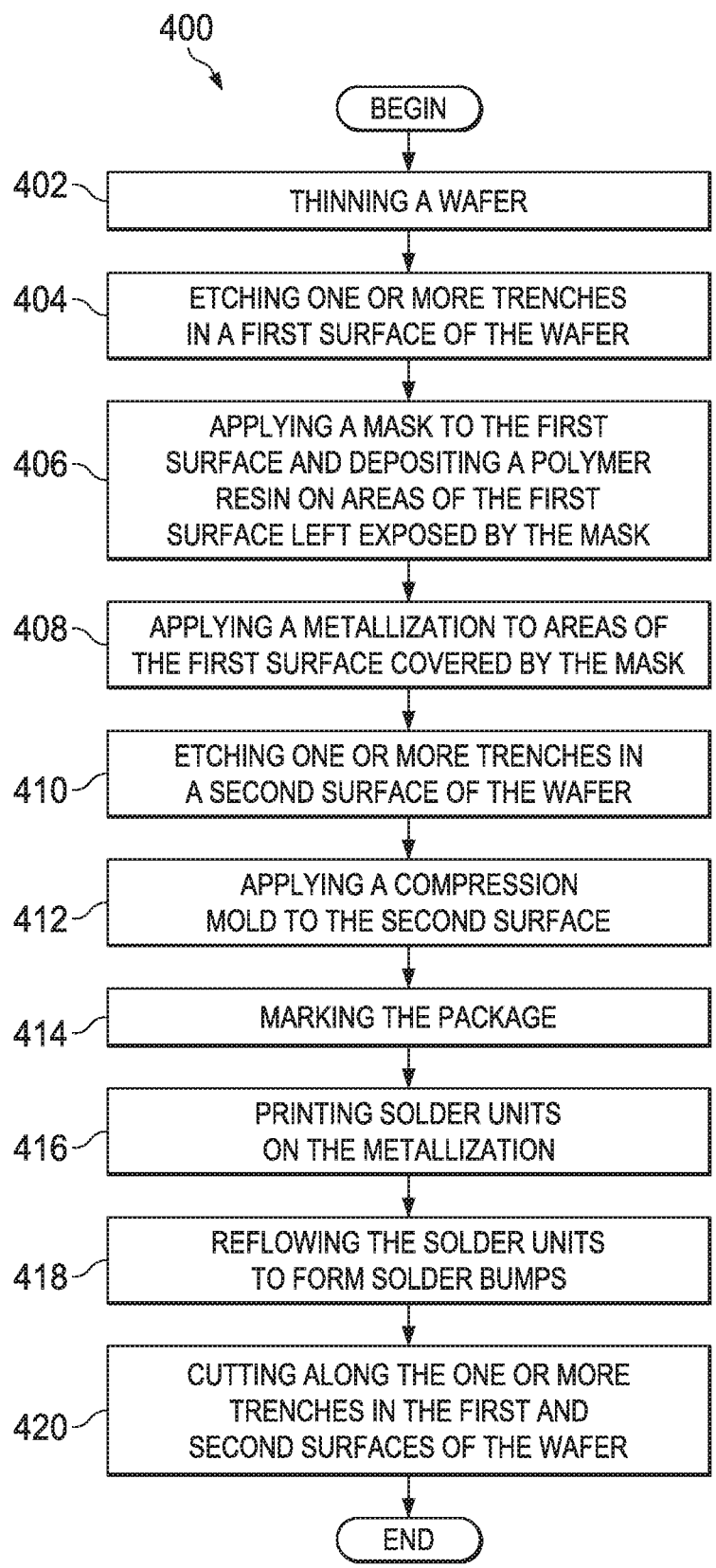
FIG. 4 is a flow diagram of a method used to package a chip as shown in FIGS. 3A-3J.

In step 418, the printed solder units 300 are reflowed to form solder bumps 302, as shown in FIG. 3I. Finally, the wafer 102 is then singulated along the trenches 104 and 112 using, e.g., a diamond blade, as lines 118 indicate in FIG. 3J (step 420). In at least some embodiments, this singulation is performed at the midpoint of the widths of the trenches 104 and 112. As a result of step 420, a single wafer 102 is divided into one or more chip scale packages. The resulting chip scale package contains a portion of the wafer 102, metallizations 110, and solder bumps 302 on the metallizations 110. The wafer 102 is entirely encapsulated by the polymer resin 106 and the compression mold 114 on opposing surfaces of the wafer 102. The sides of the wafer 102 are stepped due to the shapes of the trenches 104 and 112, and each of the sides of the wafer 102 is encapsulated by the polymer resin 106 and the compression mold 114. The method 400 may be adjusted as desired, including by adding, deleting or modifying one or more steps.

Figure 5A:
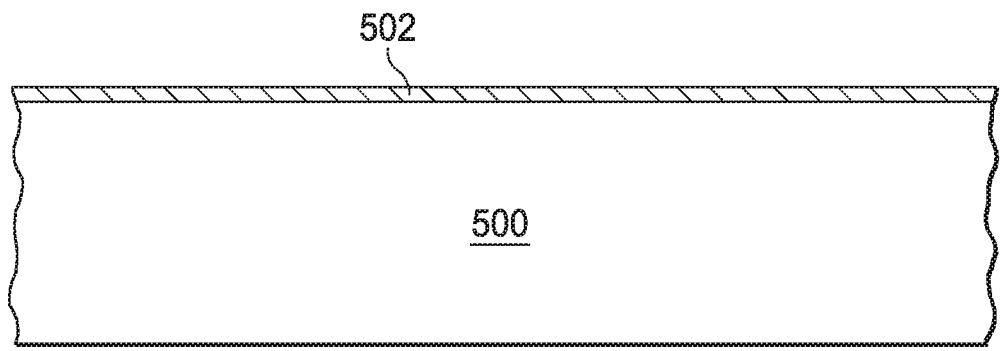
FIGS. 5A-5K are cross-sectional schematic diagrams illustrating an alternative chip packaging process flow.
Figure 5B:
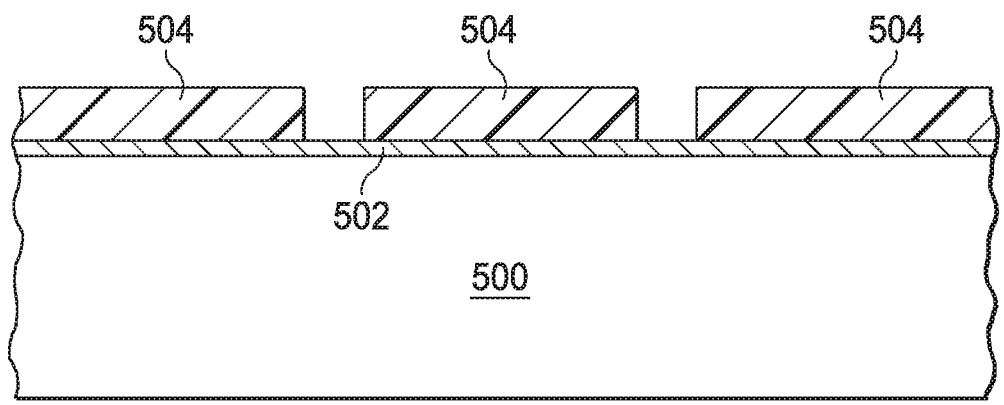
Figure 5C:
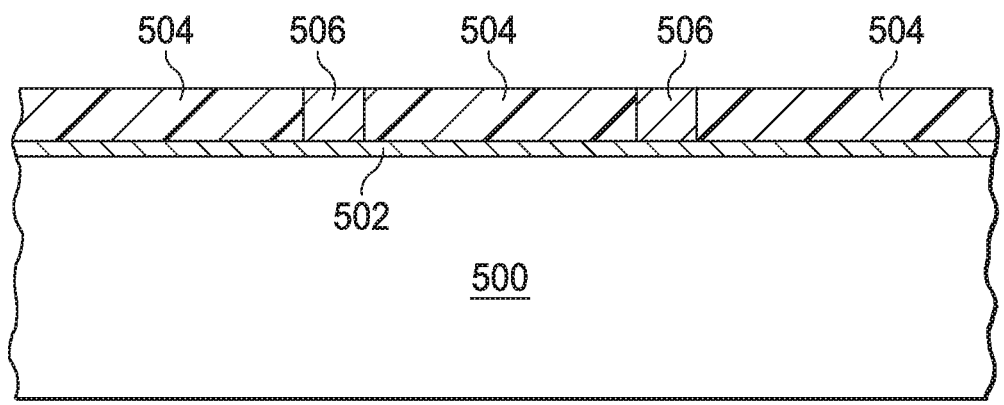
Figure 5D:
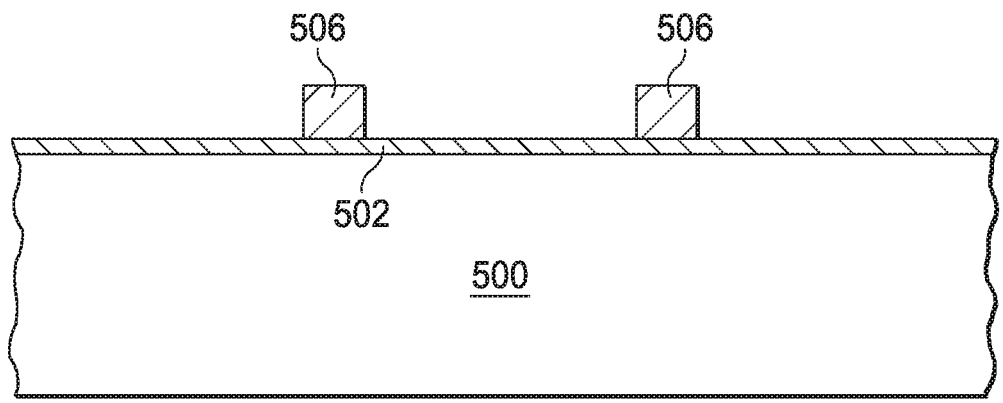
Figure 5E:
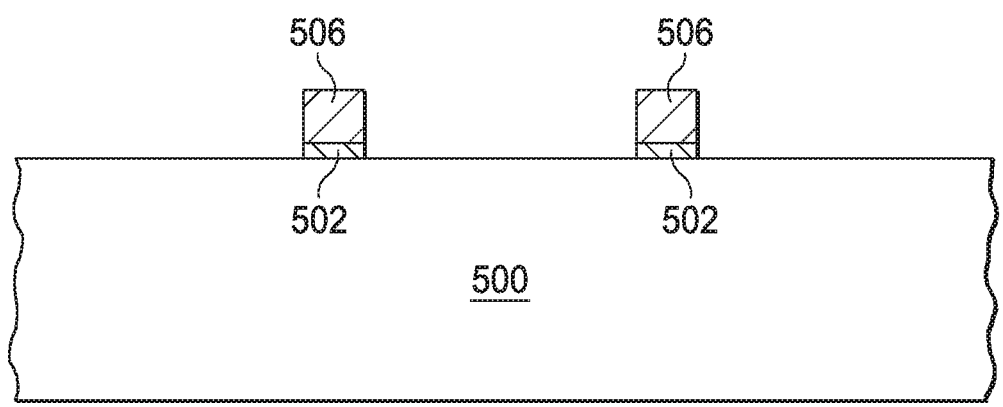
Figure 5F:
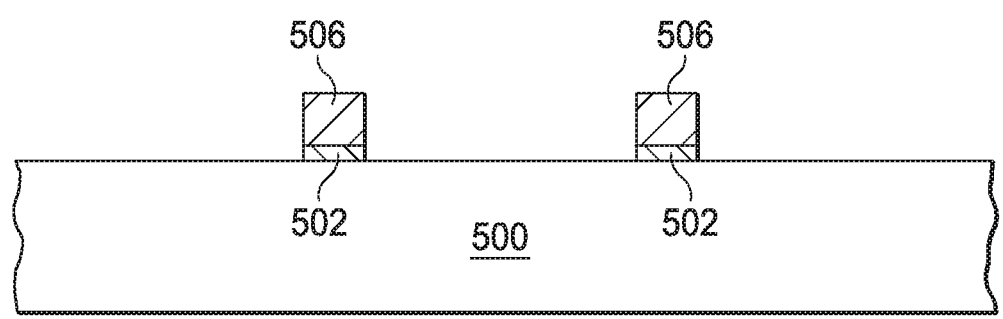
Figure 5G:
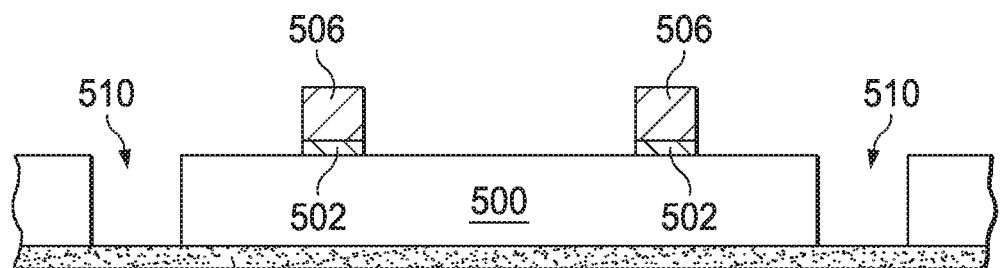
Figure 5H:
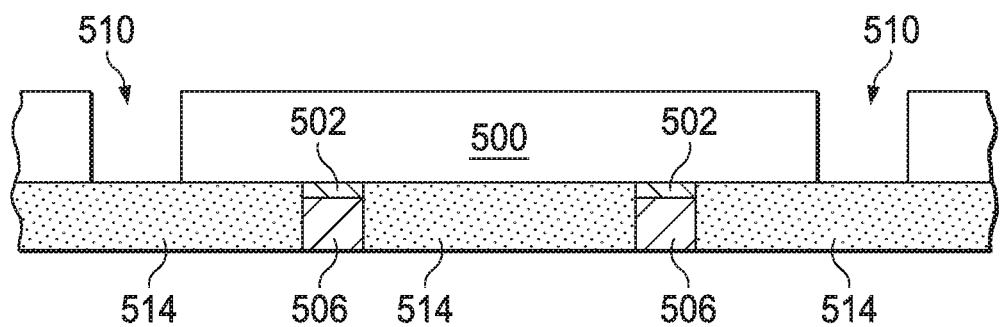
Figure 5I:
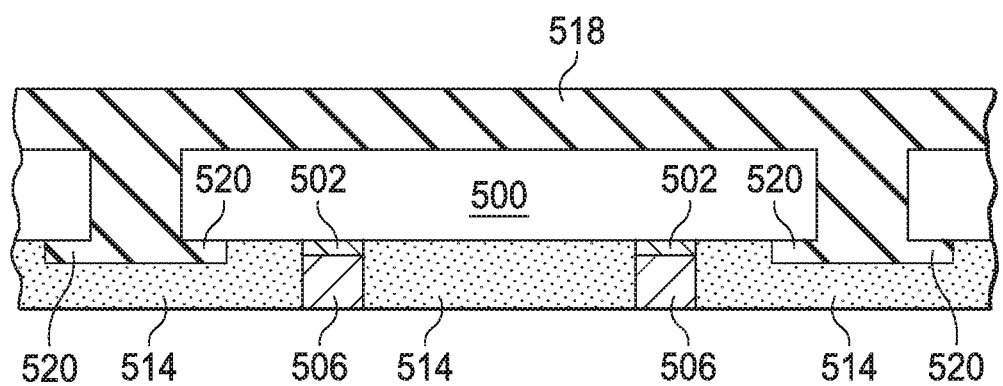
Figure 5J:
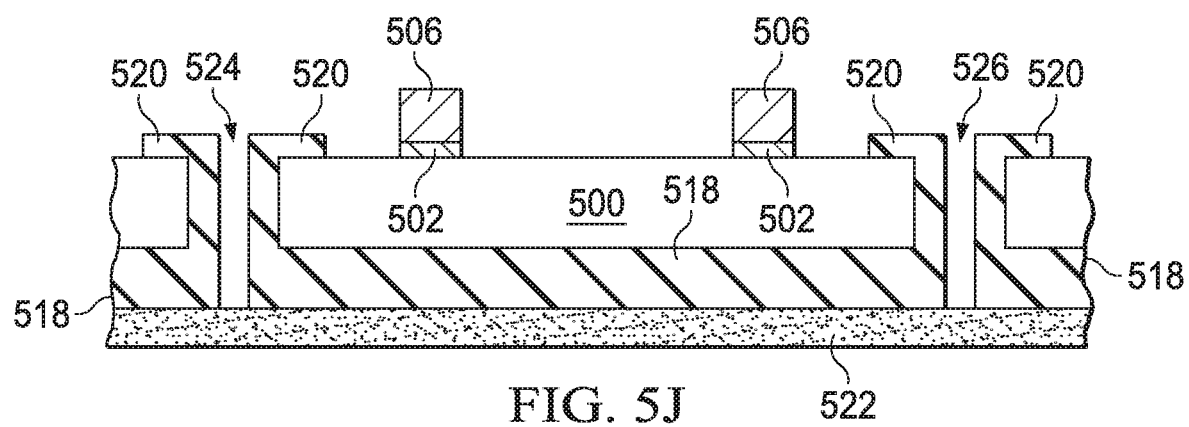
Figure 5K:
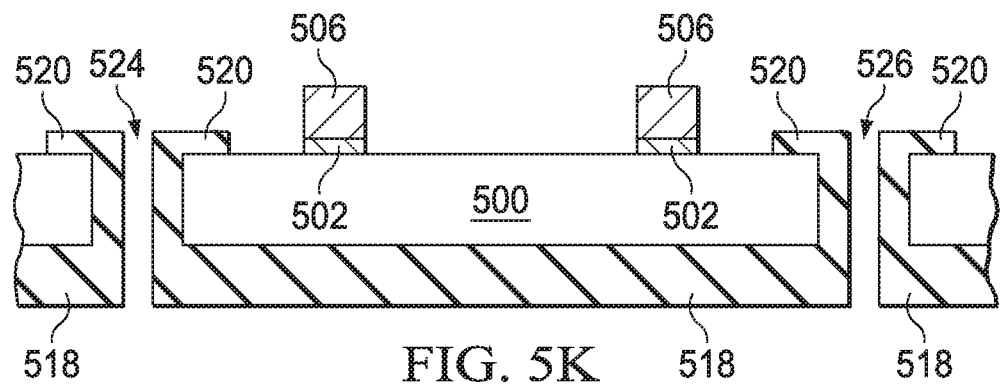
Figure 6:
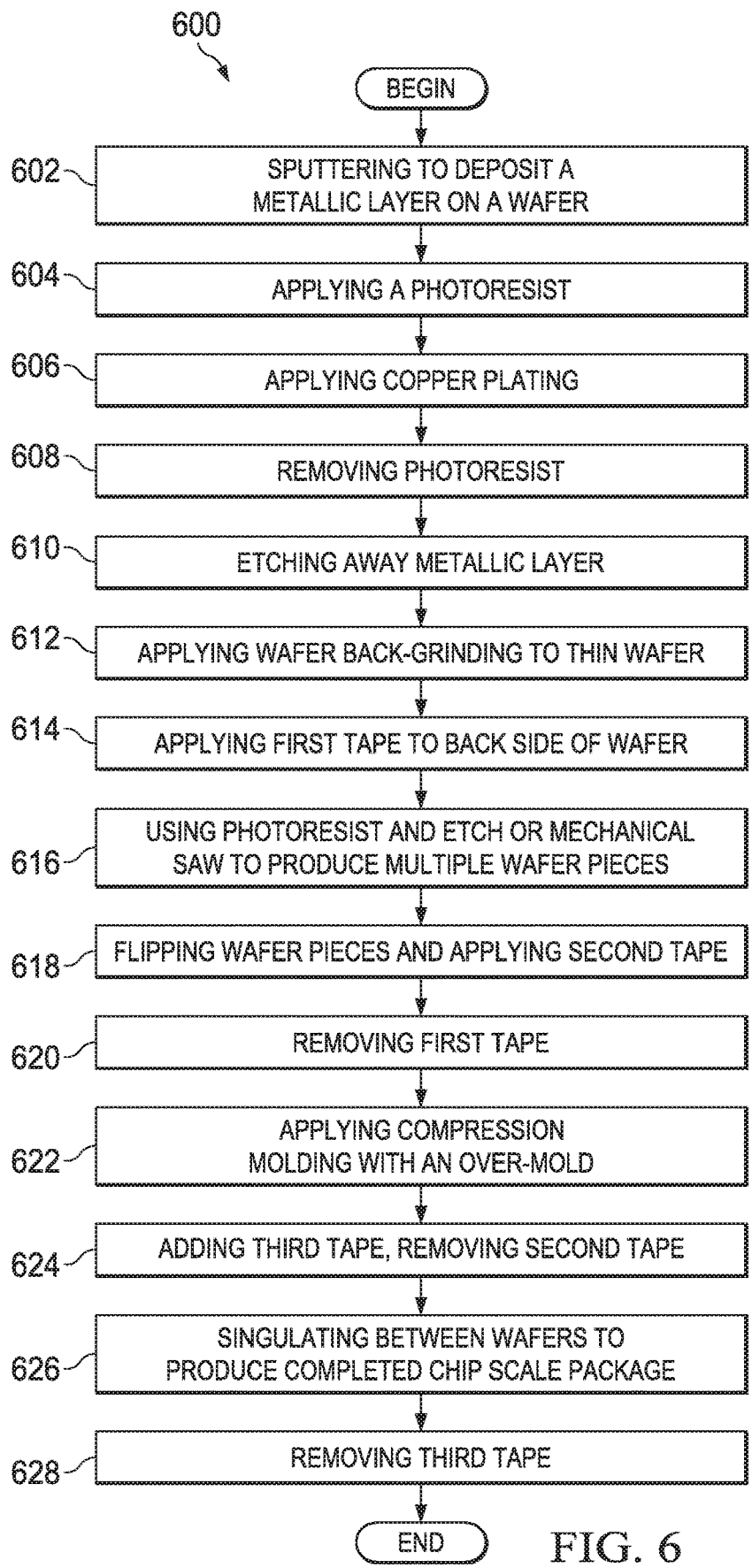
FIG. 6 is a flow diagram of a method used to package a chip as shown in FIGS. 5A-5K.

FIGS. 5A-5K illustrate an alternative chip packaging process flow. FIG. 6 is a flow diagram of a method 600 used to produce a chip scale package as shown in FIGS. 5A-5K. Because the steps of the method 600 are illustrated in FIGS. 5A-5K, these figures are described in relation to each other. The method 600 begins with the use of a sputtering technique to deposit a metallic layer on a wafer (step 602). FIG. 5A shows a metallic layer 502 deposited on the top surface of a wafer 500. The metallic layer 502 comprises any suitable material including, for example and without limitation, tin, copper, or an alloy thereof. Although the metallic layer 502 may be deposited using a sputtering technique, the scope of disclosure is not limited to any particular deposition technique. The thickness of the metallic layer 502 may be chosen as desired, but in at least some embodiments, it is approximately 5 micrometers.

The method 600 then comprises applying a photoresist to the metallic layer (step 604). FIG. 5B depicts this step—specifically, it illustrates a photoresist 504 deposited on the metallic layer 502, which, in turn, is deposited on the wafer 500. The photoresist 504 is deposited in a pattern (e.g., using a mask) so that the areas left exposed by the photoresist 504 are those on which metallization may subsequently be deposited. The thickness of the photoresist varies, but in at least some embodiments, it is approximately 40 micrometers. The method 600 next includes applying metallization (step 606). As shown in FIG. 5C, metallization 506 is deposited onto the areas of the metallic layer 502 left exposed by the photoresist 504. The specific metallization pattern used is application specific and may be formed as desired. In at least some embodiments, the metallization 506 has an approximate thickness of 40 micrometers and an approximate width of 40 micrometers.

The method 600 further comprises removing the photoresist (step 608; FIG. 5D) and etching away the metallic layer (step 610; FIG. 5E) using any suitable etching technique, such as—without limitation—a dry chemical etching technique, DRIE technique or NSS technique. As FIG. 5E shows, only the portions of the metallic layer 502 under the metallization 506 remain. The bottom surface of the wafer 500 is then subjected to a back-grinding process to thin the wafer, as numeral 508 indicates in FIG. 5F (step 612). After the back-grinding process is complete, the wafer 500 may have an illustrative thickness of approximately 200 micrometers.

A first tape 512 is then applied to the bottom surface of the wafer 500 (step 614; FIG. 5G) and a mechanical saw or a photoresist (e.g., a silicon photoresist) in combination with a suitable etching technique (e.g., DRIE or NSS) is used to divide the wafer into multiple pieces (step 616; FIG. 5G). In at least some embodiments, the tape 512 has a thickness of approximately 20 micrometers and is composed of any suitable material, such as acrylate polymer. Next, the method 600 comprises flipping the wafer pieces and applying a second tape 514 to the top surfaces of the wafer pieces (step 618; FIG. 5H). Although the wafer has been divided into pieces, the pieces are easily and simultaneously flipped because the tape 512 holds the wafer pieces in position during the flipping process. After the second tape 514 is applied, the first tape 512 is removed (step 620; FIG. 5H).

The second tape 514 may have any suitable thickness (e.g., approximately 100-150 micrometers). In at least some embodiments, the second tape 514 comprises thermosensitive tape or ultraviolet-curing tape. The degree of adhesion provided by the second tape 514 may vary based on the degree of heat used (in the case of thermosensitive tape) or the degree of ultraviolet curing performed (in UV-curing tape), but the adhesion preferably is such that when a compression mold 518 is applied as depicted in step 622 and FIG. 5I, at least a portion of the compression mold seeps between second tape 514 and the top surface of the wafer 500 to produce an "over-mold." Numeral 520 depicts this over-mold in FIG. 5I. To achieve the over-mold 520, the pressure with which the compression mold is applied—as well as the viscosity of the compression mold itself—may be dynamically adjusted, taking into account the degree of adhesion provided by the second tape 514. The width of the over-mold 520 may vary, but in at least some embodiments, it is approximately 200-250 micrometers. Similarly, the thickness of the over-mold 520 varies, but in at least some embodiments, it is approximately 20 micrometers. In at least some embodiments, the compression molding comprises any suitable material (e.g., polyamides, polyimides, polyamide-imides, polyphenylene sulfide (PPS), polyether ether ketone (PEEK), and polyester fiberglass resin).

After the compression mold 518 is applied, a third tape 522 is applied, the second tape 514 is removed, and the wafer assembly is flipped (step 624; FIG. 5J). In at least some embodiments, the third tape 522 is composed of the same material as the tape 512. The method 600 also comprises performing a singulation technique (e.g., using a diamond blade) to divide the wafer pieces into separate chip scale packages, as indicated by numerals 524 and 526 in FIG. 5J (step 626). Finally, the method 600 includes removing the third tape 522 (step 628; FIG. 5K). The singulated chip scale package includes compression molding on the bottom and side surfaces of the wafer, and it further includes compression molding (i.e., the over-mold 520) on a portion of the top surface of the wafer. In at least some embodiments, the compression molding on the top surface of the wafer forms one or more strips about the perimeter of the top surface. In at least some embodiments, the strips have an average width of approximately 40-60 micrometers. In at least some embodiments, the strips occupy between approximately 20 and 40 percent of the total area of the top surface. Compression molding is said to be applied in a "strip" or along a "perimeter" of the surface of a wafer if the compression molding follows the perimeter of the surface and occupies no more than half of the area of the surface.

Numerous other variations and modifications will become apparent to those skilled in the art once the above disclosure is fully appreciated. It is intended that the following claims be interpreted to embrace all such variations, modifications and equivalents.

What is claimed is:

1. A chip scale package, comprising:
    a semiconductor die having a top surface, a bottom surface, and side surfaces;
    a metallization layer coupled on the top surface of the semiconductor die; and
    a compression mold coupled on the bottom surface of the die, on the side surfaces of the die, and on a portion of the top surface of the die, the compression mold forming a strip along at least a part of a perimeter of the top surface where the strip directly contacts only the top surface.

2. The chip scale package of claim 1, wherein the strip has an average width between 40 and 60 micrometers, inclusive.

3. The chip scale package of claim 1, wherein the strip occupies between 20 percent and 40 percent, inclusive, of a total area of the top surface excluding metallization.

4. The chip scale package of claim 1, wherein the compression mold is made of a material selected from the group consisting of: polyamides, polyimides, polyamide-imides, polyphenylene sulfide (PPS), polyether ether ketone (PEEK), and polyester fiberglass resin.

5. The chip scale package of claim 1, wherein the top and bottom surfaces oppose each other.

6. A chip scale package, comprising:
    a semiconductor die having a first largest planar surface, a second largest planar surface, and side surfaces across a thickness between the first largest planar surface and the second largest planar surface;
    a metallization layer coupled on the first largest planar surface of the semiconductor die; and
    a compression mold coupled on the second largest planar surface of the die, on the side surfaces of the die, and on a portion of the first largest planar surface of the die, wherein a portion of the compression mold forms a strip along a perimeter of the first largest planar surface and is only in contact with the first largest planar surface.

7. The chip scale package of claim 6, wherein the strip has a width between 40 and 60 micrometers.

8. The chip scale package of claim 6, wherein the strip occupies between 20 percent and 40 percent of a total area of the first largest planar surface.

9. The chip scale package of claim 6, wherein the compression mold is made of a material selected from the group consisting of: polyamides, polyimides, polyamide-imides, polyphenylene sulfide (PPS), polyether ether ketone (PEEK), and polyester fiberglass resin.

10. The chip scale package of claim 6, wherein the first largest planar surface and second largest planar surface oppose each other.

11. A chip scale package, comprising:
a semiconductor die having a first largest planar surface, a second largest planar surface, and side surfaces across a thickness between the first largest planar surface and the second largest planar surface;
a metallization layer coupled on the first largest planar surface of the semiconductor die; and
a compression mold coupled on the second largest planar surface of the die, on the side surfaces of the die, and on a portion of the first largest planar surface of the die, the compression mold on the portion of the first largest planar surface contacting only the first largest planar surface.

12. The chip scale package of claim 11, wherein the strip has a width between 40 and 60 micrometers.

13. The chip scale package of claim 11, wherein the strip occupies between 20 percent and 40 percent of a total area of the first largest planar surface.

14. The chip scale package of claim 11, wherein the compression mold is made of a material selected from the group consisting of: polyamides, polyimides, polyamide-imides, polyphenylene sulfide (PPS), polyether ether ketone (PEEK), and polyester fiberglass resin.

15. The chip scale package of claim 11, wherein the first largest planar surface and second largest planar surface oppose each other.

* * * * *